(12) United States Patent
Zettler et al.

(10) Patent No.: US 8,810,798 B2
(45) Date of Patent: Aug. 19, 2014

(54) METHOD AND APPARATUS FOR REAL-TIME DETERMINATION OF SPHERICAL AND NON-SPHERICAL CURVATURE OF A SURFACE

(75) Inventors: Jorg-Thomas Zettler, Berlin (DE); Christian Kaspari, Berlin (DE)

(73) Assignee: Laytec AG, Berlin (DE)

( * ) Notice: Subject to any disclaimer, the term of this patent is extended or adjusted under 35 U.S.C. 154(b) by 205 days.

(21) Appl. No.: 13/544,939

(22) Filed: Jul. 9, 2012

(65) Prior Publication Data

US 2013/0021610 A1    Jan. 24, 2013

(30) Foreign Application Priority Data

Jul. 11, 2011  (DE) .......................... 10 2011 078 980
Nov. 21, 2011  (EP) ..................................... 11189985

(51) Int. Cl.
*G01B 11/24* (2006.01)
*G01B 11/255* (2006.01)
*H01L 21/66* (2006.01)

(52) U.S. Cl.
CPC .............. *G01B 11/255* (2013.01); *H01L 22/12* (2013.01)
USPC ........................................................ 356/601

(58) Field of Classification Search
None
See application file for complete search history.

(56) References Cited

U.S. PATENT DOCUMENTS 7,391,523 B1    6/2008    Taylor, II et al.

FOREIGN PATENT DOCUMENTS

| DE | 19842190 | 3/2000 |
|---|---|---|
| EP | 2299236 | 3/2011 |
| WO | WO2009/102502 | 8/2009 |

*Primary Examiner* — Tarifur Chowdhury
*Assistant Examiner* — Amanda Merlino
(74) *Attorney, Agent, or Firm* — VLP Law Group LLP; Kent H. Cheng

(57) ABSTRACT

The present invention provides for an apparatus for measuring a curvature of a surface of a wafer in a multi-wafer epitaxial reactor.

14 Claims, 8 Drawing Sheets

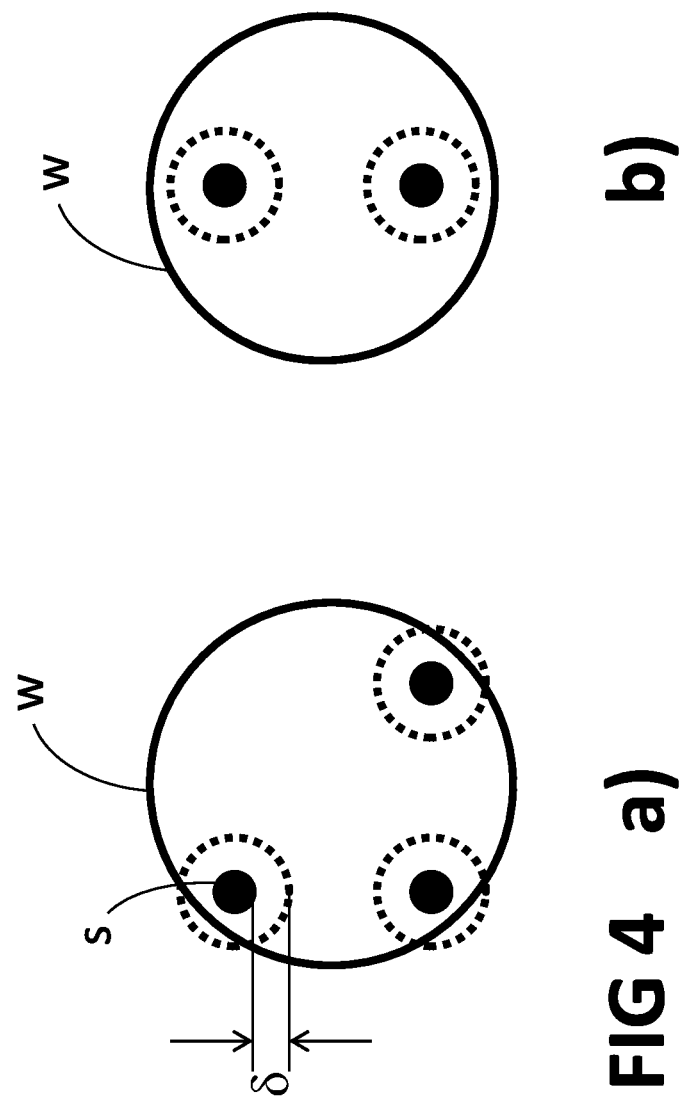

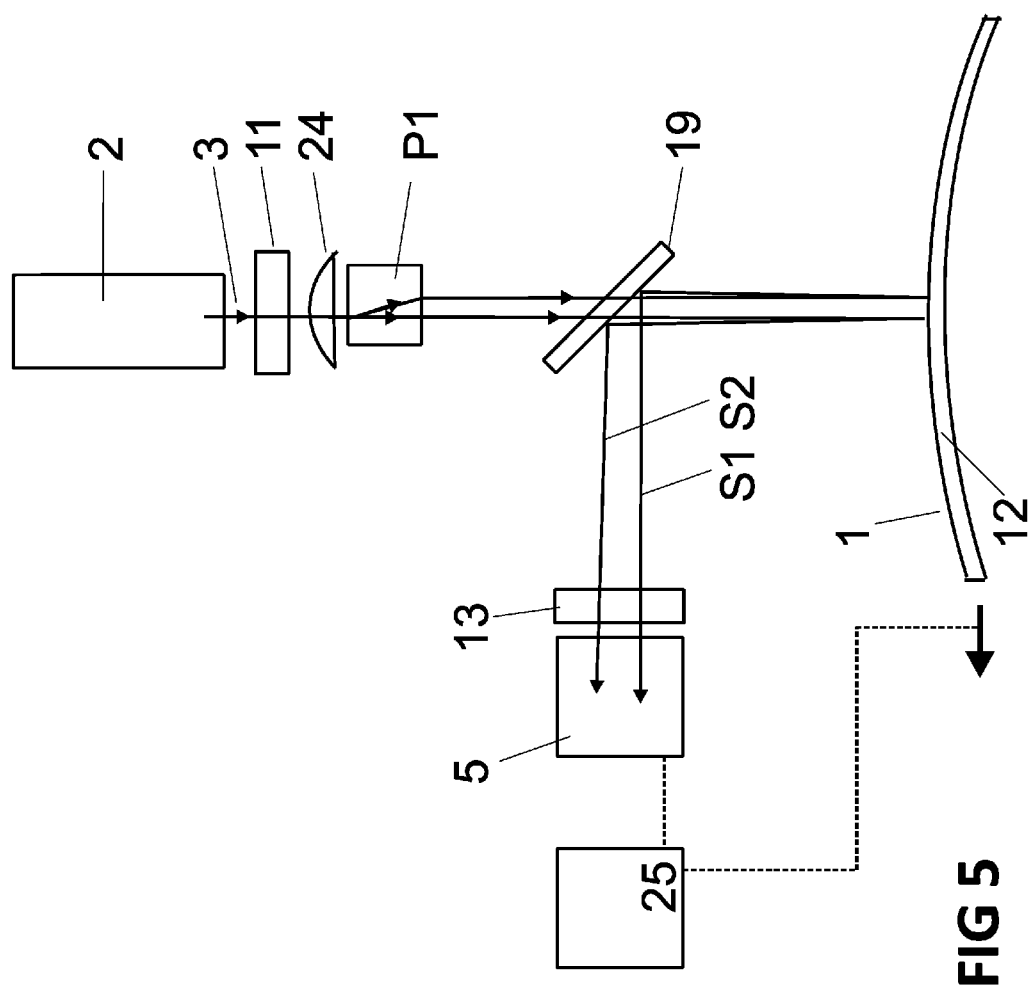

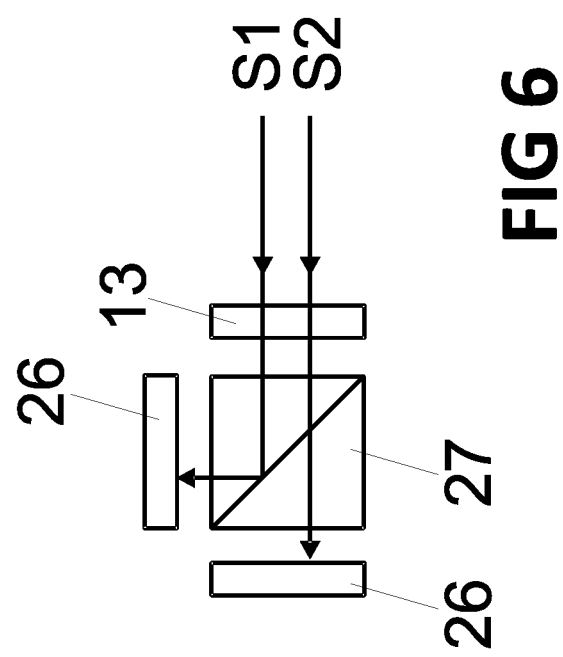

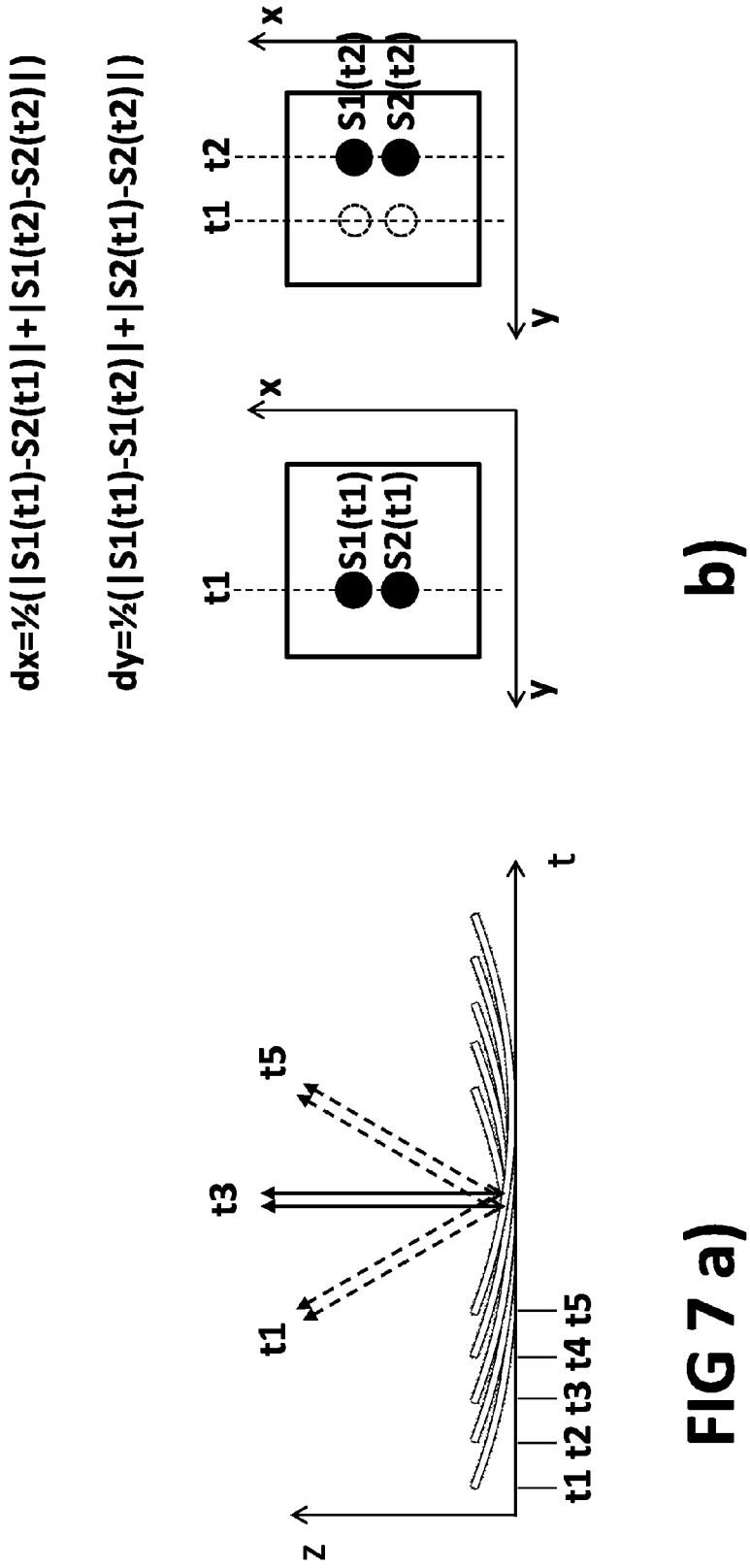

METHOD AND APPARATUS FOR REAL-TIME DETERMINATION OF SPHERICAL AND NON-SPHERICAL CURVATURE OF A SURFACE

BACKGROUND OF THE INVENTION

1. Field of the Invention

The present invention relates to a method and an apparatus for determining the local spherical and non-spherical (or aspherical) curvature of -rotating samples in multi-wafer epitaxial growth reactors as well as the related curvature variations across these samples. These samples typically are semiconductor wafers with epitaxial layers grown on their surface and the apparatus is intended to be applied during the epitaxial layer deposition.

2. Description of Related Art

During epitaxial growth of semiconductor wafers the growth processes have to be monitored in dependence of different parameters as, for example, the growing layer thickness, the temperature, the doping concentration, or the smoothness of the wafer surface. Among others, an accurate measurement of the curvature of the wafer is necessary because it correlates directly to the strain in the growing layers and indirectly to the composition of these layers. In particular during epitaxial thin-film growth on wafers in multi wafer reactors it is necessary to determine permanently the curvature of all wafers as exactly as possible in the shortest possible time. This is essential for facilitating high-yield epitaxial processes for the manufacture of semiconductor devices.

From U.S. Pat. No. 7,570,368 B2 a device is known for the measurement of the curvature of a surface, in which a single light beam and a two-dimensional detector are employed for determining the curvature of the surface, which is derived via the detection of the sample position as a function of time and from the position (x, y) of the light spot reflected from the surface to be measured and detected on the detector plane. U.S. Pat. No. 7,570,368 B2 assumes a uniform and strictly spherical bow at every point of the sample (spherical wafer bow approximation).

As it is sketched in FIG. 1, the simplest approximation for the bowing shape of a semiconductor wafer is to assume the same curvature C at every point $(R,\phi)$ with $R<R_S$ and $\phi \in [0, 360°)$, wherein $R_S$ is the radius of the circular wafer. The curvature C is measured as inverse bowing radius $1/r_w$. This approximation is named "spherical wafer bow approximation", because the shape of the wafer bow $z(R,\phi)$ is identical to a segment of a sphere's surface with the corresponding sphere having a radius $r_w$: $C(R,\phi)=\text{const}=1/r_w$. This approximation is also used in U.S. Pat. No. 5,912,738, in DE 103 61 792 B4, and in DE 10 2005 023 302 B4.

However, when determining the curvature of a double rotating semiconductor wafer (see FIG. 3) in a reactor during epitaxial growth, problems arise, due to the fact that real wafers are usually not uniformly bent, but the curvature may vary with the rotation angle, as depicted in FIG. 2a, thereby leading to unwanted fluctuations in the curvature measurements between a maximum value (along the direction of $L_2$ in FIG. 2a) and a minimum value (along $L_1$ in FIG. 2a). Moreover, if the epitaxial process is not adequately controlled, defects may be generated and relaxation processes may occur in the semiconductor wafers during fabrication, which according to their symmetry may further modify the rotational asymmetry (azimuthal aspheric bow) of the sample.

In such cases, specifically due to unavoidable wobble during satellite rotation $\omega_{sat}$, a solution according to U.S. Pat. No. 7,570,368 B2 cannot be used and also U.S. Pat. No. 5,912,738, U.S. Pat. No. 7,391,523 and DE 103 61 792 cannot be applied, because they can only determine the spherical curvature magnitude $C_{sph}$.

Because in real semiconductor technology the wafer bow typically deviates from the ideal spherical bow, in European patent application 2,299,236 A1 the more realistic "azimuthal aspherical bow approximation" was used (named "azimuthal asymmetrical approximation" in EP 2,299,236 A1), according to which the local curvature of a wafer is described as an ideal spherical bow plus the superposition of an azimuthal (only $\phi$-dependent) aspherical bow deviation.

Accordingly, European Patent Application 2 299 236 A1 is directed to a method and an apparatus for a real-time determination of the curvature of a rotating sample as well as the azimuthal asymmetry of the curvature. This is achieved by irradiating three parallel laser beams onto the sample surface and by detecting a first distance between the position of the reflected first light beam and the position of the reflected third light beam and a second distance between the position of the reflected second light beam and the position of the reflected third light beam. In this way, both curvature components $C_{sph}$ and the azimuthal aspherical curvature deviation $\Delta C_{asph}$ can be measured in an epitaxial reactor with sufficiently large viewport size.

The separate measurement of those two curvature components (spherical curvature magnitude $C_{sph}$ and azimuthal aspherical curvature deviation $\Delta C_{asph}$) for a rotating sample results in a significant "noise" reduction in $C_{sph}$ measurements and in an access to strain-induced defect generation. As a drawback, said apparatus irradiating three laser beams can only be employed in epitaxial growth reactors having a medium-sized access window with a diameter between 5 mm and 20 mm or larger. This constraint follows from the fact that the distance between two laser beam ought not to be smaller that 0.5 mm and that the laser spot ought to have a minimum distance δ from the access window edge of 0.3 mm in order to avoid artefacts.

However, some epitaxial reactors, the so-called "close-coupled showerhead" reactors, enable only a very small access window, i.e. with a diameter between 1 mm and 5 mm, so that the size of the window is too small for irradiating three laser beams. FIG. 4 shows the projections of the incoming laser beams through an access window of an epitaxial reactor for an apparatus irradiating three beams (a) and for an apparatus according to an aspect of the present invention irradiating two beams (b), wherein w represents the edge of the access window through which the laser beams may access the epitaxial reactor, s indicates the center of the irradiated laser spots and δ is the minimum distance between the laser spot and the window edge in order to avoid artefacts.

SUMMARY OF THE INVENTION

It is therefore an object of the present invention to provide a method and an apparatus for determination of the mean spherical curvature and the azimuthal aspherical curvature deviation of samples in epitaxial reactors with only small access windows.

It is a further object of the present invention to effectively determine a film relaxation of the sample and/or the formation of defects on the sample, thus providing important parameters for controlling the fabrication process, even in reactors with small access windows and wherein the wafers have no self rotation around their own center but only perform a common main rotation around a rotation center.

Aspects of exemplary embodiments of the present invention are directed to an apparatus for measuring a curvature of a surface, comprising means adapted for irradiating a first light beam and a second light beam onto a surface of a sample, wherein the first light beam and the second light beam are parallel to each other, and a detector, wherein the detector comprises at least one detector plane and is adapted to detect a first position of the reflected first light beam in the at least one detector plane and a first position of the reflected second light beam in the at least one detector plane at a first sampling time and to detect a second position of the reflected first light beam in the at least one detector plane and a second position of the reflected second light beam in the at least one detector plane at a second sampling time. The apparatus further comprises means adapted to synchronize the detector sampling time with the sample main rotation, means adapted to determine a first distance between the first position of the reflected first light beam and the first position of the reflected second light beam measured at the first sampling time, adapted to determine a second distance between the second position of the reflected first light beam and the second position of the reflected second light beam measured at the second sampling time, adapted to determine a third distance between the first position of the reflected first light beam measured at the first sampling time and the second position of the reflected first light beam measured at the second sampling time, and adapted to determine a fourth distance between the first position of the reflected second light beam measured at the first sampling time and the second position of the reflected second light beam measured at the second sampling time. The apparatus further comprises means adapted to determine a mean spherical curvature of the surface and an azimuthal aspherical curvature deviation from the first distance, the second distance, the third distance and the fourth distance.

In the sense of the present invention, the first and second positions are understood as the positions of the centre of the spots, where the reflected first light beam and the reflected second light beam, respectively, hit the detector plane. The second sampling time is different from the first sampling time.

The apparatus may further comprise means adapted to control fabrication process parameters for the sample according to the determined mean spherical curvature and/or according to the determined azimuthal aspherical curvature deviation from the mean spherical curvature.

Preferably, each sample in the multi-wafer epitaxial reactor has a circular shape with a diameter ranging between 50-200 mm. Preferably, the distance between the light beams before reflection at the sample surface ranges between 0.5 and 5 mm. More preferably, the initial distance between the first light beam and the second light beam ranges between 0.5 mm and 3.0 mm and even more preferably between 0.5 mm and 1.0 mm.

Preferably, the means for irradiating the first light beam and the second light beam comprises a light source for irradiation of an initial polarized, unpolarized or partially polarized single light beam, and a birefringent element arranged between the light source and the surface of the sample such that the light beam of the light source passes through the birefringent element, wherein the main axis of the birefringent element is oriented with respect to the light beam of the light source such that the light beam is split up into the first and second light beams.

Preferably, the first light beam and the second light beam have the same intensity.

Preferably, the means adapted to synchronize the detector sampling times with the sample main rotation are adapted to generate at least two sampling times for each wafer. More preferably, the number of sampling times for each wafer ranges between 2 and 20, even more preferably between 4 and 16 and even more preferably between 8 and 12.

Preferably, the number of sampling times for each wafer is an even number and the means for irradiating the first and second light beams is positioned in such a way to irradiate the first and second light beams at the two central sampling times onto four spots of the surface of the sample symmetrically arranged around the center of the corresponding sample.

Preferably, the sample comprises a plurality of wafers arranged along a main circle having a radius much larger than the radius of each wafer and rotating around the centre of the main circle with a main rotation speed. Preferably, the radius of the main circle is at least 5 times larger than the radius of each wafer. More preferably, the radius of the main circle is at least 10 times larger than the radius of each wafer.

Preferably, the means for irradiating the first and second light beams is positioned in such a way to irradiate at each sampling time the first and second light beams on two spots of the surface of the sample arranged along a first direction perpendicular to a second direction determined by the tangent to the main circle along which the wafers are arranged in the centre of the wafer.

According to another preferred embodiment it is possible to radially scan the incident light beams from the periphery over the center and to the opposite periphery of the sample surface.

Preferably, the means for irradiating the first and second light beams is positioned such to irradiate the first light beam and the second light beam onto the surface of the sample along an axis having an angle of less than 10° with respect to the surface normal of the sample. More preferably, the means for irradiating the first and second light beams is positioned such to irradiate the first light beam and the second light beam perpendicularly to the surface of the sample. The perpendicular irradiation is best suited for avoiding artifacts due to insufficient distances between the light beams and the access window edge.

In a preferred embodiment of the present invention, the fast 2D-detector comprises a fast CCD camera, capable of taking a sufficiently high number of measurements on each wafer during main rotation.

In a further preferred embodiment of the present invention, the fast 2D-detector comprises a polarizing beam splitter adapted to separate the reflected first light beam from the reflected second light beam, a first position sensitive detector comprising one detector plane and being adapted to detect the position of the reflected first light beam in the detector plane, and a second position sensitive detector comprising one detector plane and being adapted to detect the position of the reflected second light beam in the detector plane.

Both embodiments are only two examples of the basic principle of this invention: combination of double-laser beam distance analysis with laser beam deflection due to sample movement for measuring spherical and aspherical bow through small viewports. Several further embodiments are possible, two more examples shall be given here. First, the two different laser beams could be generated in a different way so that both have different color. Then a dichroitic beam-splitter instead of the polarizing beam-splitter could be used in the embodiment with two PSDs. Second, by alternating modulation of both laser beams the separate position detection of both laser beams could be done with a single PSD synchronized to the modulation instead of separation through beam-splitters.

Further aspects of exemplary embodiments of the present invention are directed to a method for measuring a curvature of a surface.

The method comprises the steps of irradiating a first light beam and a second light beam onto a surface of a wafer in a multi-wafer epitaxial reactor, detecting, by a detector comprising at least one detector plane, a first position of the reflected first light beam in the at least one detector plane and a first position of the reflected second light beam in the at least one detector plane at a first sampling time, detecting a second position of the reflected first light beam in the at least one detector plane and a second position of the reflected second light beam in the at least one detector plane at a second sampling time, determining a first distance between the first position of the reflected first light beam and the first position of the reflected second light beam measured at the first sampling time, determining a second distance between the second position of the reflected first light beam and the second position of the reflected second light beam measured at the second sampling time, determining a third distance between the first position of the reflected first light beam measured at the first sampling time and the second position of the reflected first light beam measured at the second sampling time, and determining a fourth distance between the first position of the reflected second light beam measured at the first sampling time and the second position of the reflected second light beam measured at the second sampling time. A mean spherical curvature and an azimuthal aspherical curvature deviation of the surface are determined from the first to fourth distances.

A first averaged distance along a first direction is preferably determined from the first distance and the second distance. A second averaged distance along a second direction perpendicular to the first direction is preferably determined from the third distance and the fourth distance. Preferably, the mean spherical curvature and the azimuthal aspherical curvature deviation of the surface are determined from the first and second averaged distances.

Preferably, the method further comprises the step of controlling fabrication process parameters for the sample according to the determined mean spherical curvature and/or according to the determined azimuthal aspherical curvature deviation from the mean spherical curvature.

Preferably, each wafer has a circular shape with a diameter ranging between 50 mm and 200 mm. Preferably, the sample comprises a plurality of wafers arranged along a main circle having a radius much larger than the radius of each wafer and rotating around the centre of the main circle with a main rotation speed. Preferably, the radius of the main circle is at least 5 times larger than the radius of each wafer. More preferably, the radius of the main circle is at least 10 times larger than the radius of each wafer.

Preferably, the sampling times of the detector are synchronized with the sample main rotation so to generate at least two sampling times for each wafer.

Preferably, the number of sampling times for each wafer is an even number and the means for irradiating the first and second light beams is positioned in such a way to irradiate the first and second light beams at the two central sampling times onto four spots of the surface of the corresponding wafer symmetrically arranged around the center of the corresponding wafer.

Preferably, the distance between the light beams before reflection at the sample surface ranges between 0.5 and 5 mm. More preferably, the distance between the first light beam and the second light beam ranges between 0.5 mm and 3.0 mm and even more preferably between 0.5 mm and 1.0 mm.

Preferably, the first and second light beams have the same intensity.

Preferably, the first light beam and the second light beam are parallel to each other prior to reflection on the sample surface.

Preferably, the sample comprises a plurality of wafers arranged in a circle with a main rotation radius and the sample performs a main rotation around the center of the circle with main rotation radius, wherein the main rotation radius is much larger than the sample radius.

Preferably, the time period between the first sampling time and the second sampling time corresponds to a rotation of the sample of much less than 360/n·degrees, wherein n is the total number of wafers. Preferably, the number of sampling times for each wafer ranges between 2 and 20, more preferably between 4 and 16 and even more preferably between 8 and 12.

Preferably, the first and second light beams are irradiated along an axis having an angle of less than 10° with respect to the surface normal of the sample. More preferably, the first, second and third light beams are irradiated perpendicularly to the surface of the sample.

According to the present invention, the local measurement of both spherical and aspherical components of curvature is enabled also in specific different types of multi-wafer epitaxial reactors with only small viewports and without satellite rotation of the wafer.

BRIEF DESCRIPTION OF THE DRAWINGS

The accompanying drawings, together with the specification, illustrate exemplary embodiments of the present invention, and, together with the description, serve to explain the principles of the present invention.

FIG. 4 shows the projections of the incoming laser beams through an access window of an epitaxial reactor for an apparatus irradiating three beams (a) and for an apparatus irradiating two beams according to an aspect of the present invention (b);

FIG. 5 is a schematic view of an apparatus for the measurement of the curvature of a sample surface for perpendicular incidence of the light beams according to an aspect of the present invention;

FIG. 6 is a schematic view of a 2D-detector according to an aspect of the present invention; and FIG. 7 is a schematic view of the effects of the movement of a wafer under the probing laser beams and their corresponding deflection, wherein a) shows a side view of the wafer and b) shows the positions of the light beams on the fast 2D-detector.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein.

Furthermore, all definitions given in the introductory part are valid throughout the application.

Figure 1:
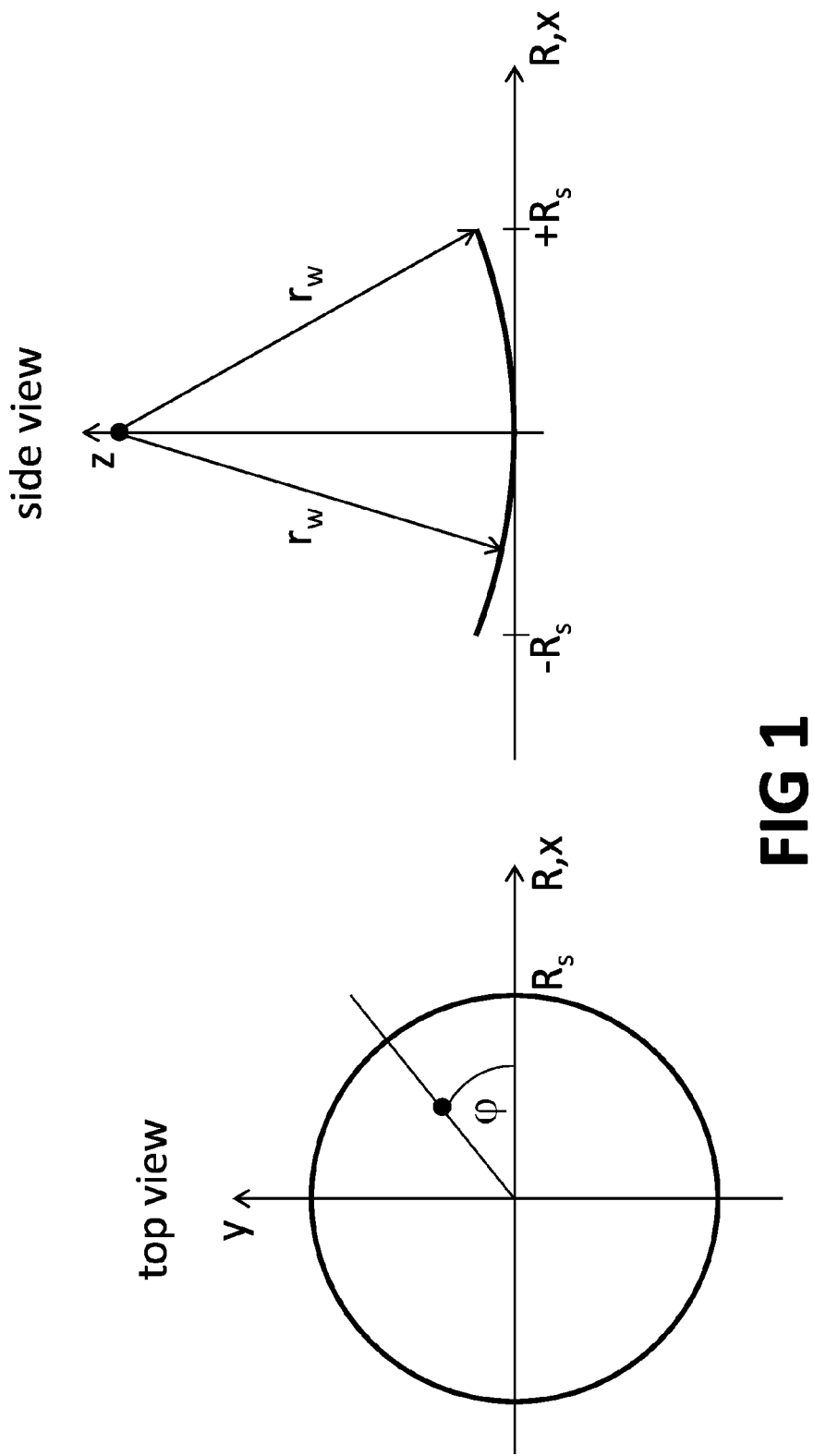
FIG. 1 shows a sample with a uniform spherical bow across the wafer, according to the spherical wafer bow approximation used in the related art.

As already mentioned in the introductory part, FIG. 1 shows a sample having a uniform spherical bow across the wafer, which corresponds to the spherical wafer bow approximation used in the related art.

However, in general the wafer bow $z(x,y)$ and the local curvature $C_{xy}(x,y)$ can be different at every point $(x,y)$ of the wafer (or at every point $(R, \phi)$ in polar coordinates) and the curvature C can be calculated for every real, typically much more complex shape $z(R,\phi)$ of the wafer according to the following formulas:

$$C_{R,\varphi}(R, \varphi) = \frac{\partial^2 z(R, \varphi)}{\partial r^2} + \frac{1}{r}\frac{\partial z(R, \varphi)}{\partial r} + \frac{1}{r^2}\frac{\partial^2 z(R, \varphi)}{\partial \varphi^2} \text{ in polar coordinates or} \quad (1)$$

$$C_{x,y}(x, y) = \frac{\partial^2 z(x, y)}{\partial x^2} + \frac{\partial^2 z(x, y)}{\partial y^2} \text{ in Cartesian coordinates} \quad (2)$$

Once the 2D-curvature distribution $C(R,\phi)$ has been determined, the wafer shape $z(R,\phi)$ can be calculated by integration of equation (1). The shape of every section of the wafer $z_{\bar{\phi}}(R)$ along a direction $\bar{\phi}$ can be calculated by partial integration of $C(R,\bar{\phi})$ along R of equation (1).

Furthermore, the "azimuthal asymmetrical approximation" known from the prior art was presented:

$$C_{R,\phi}(\phi) = C_{sph} + \delta C(\phi) = C_{sph} + \Delta C_{asph} \sin 2\phi \quad (3).$$

Figure 2:
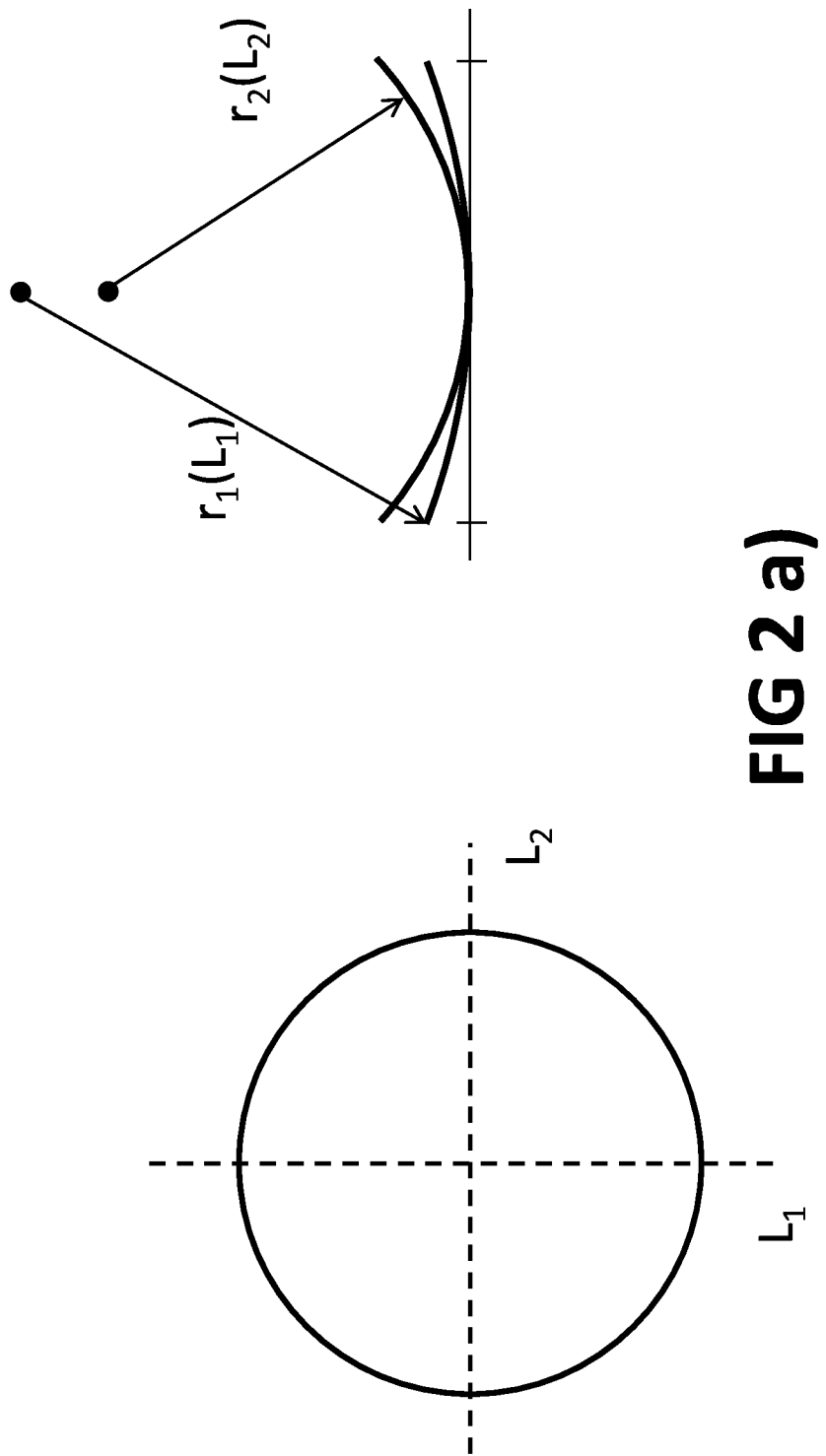
FIG. 2a shows an exemplary, circular sample exhibiting azimuthal asphericity, i.e., different curvature radii $r_1$ and $r_2$ along two cross-section lines $L_1$ and $L_2$ having different azimuthal angles $\phi$ with respect to a given fixed reference line through the centre of the sample.
FIG. 2b shows an exemplary sample with radial non-uniform curvature radii $r_x(R)$, $r_y(R)$.
Figure 2:
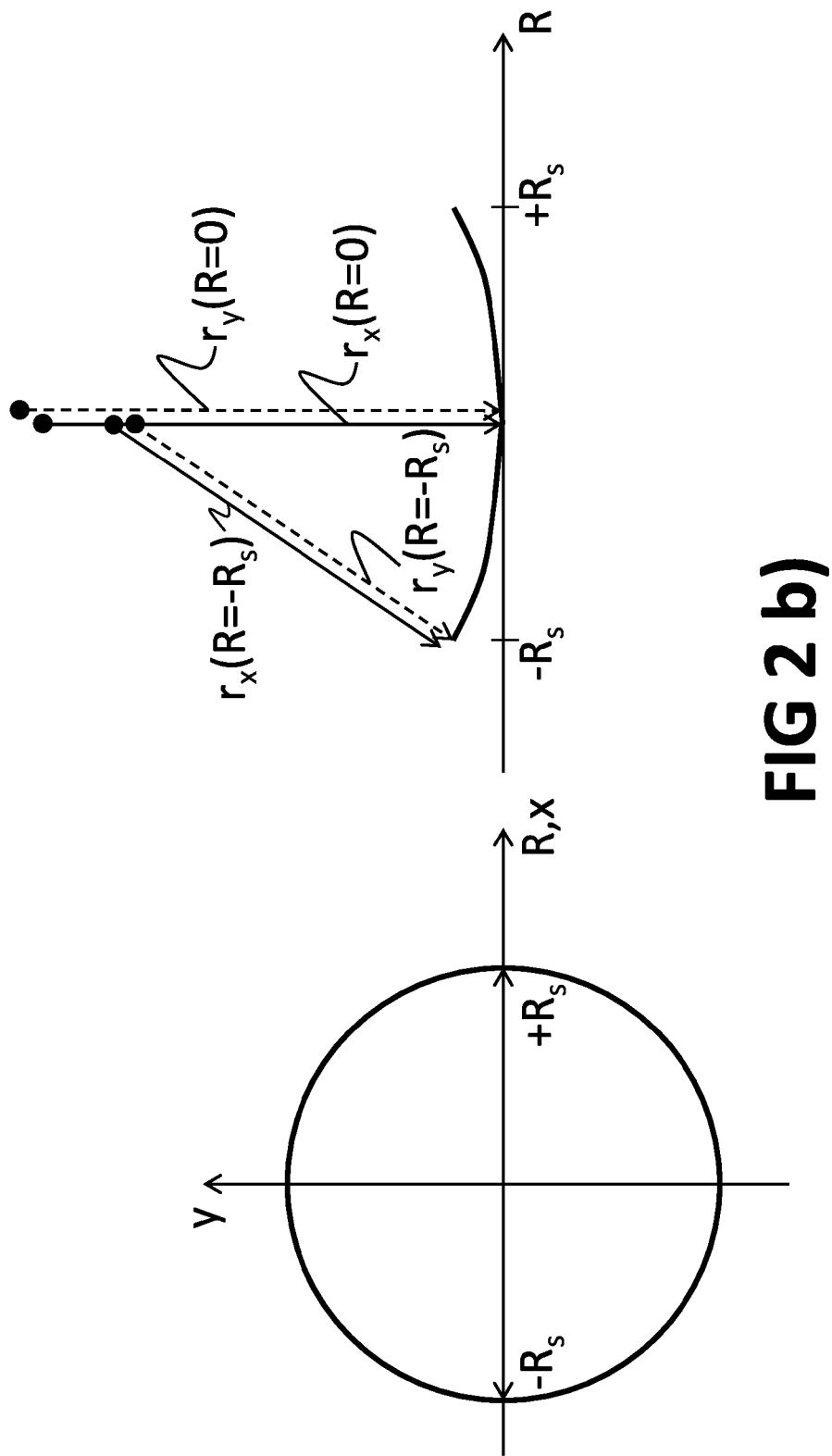

This means that the local curvature of a wafer is described as an ideal spherical bow plus the superposition of an azimuthal (only $\phi$-dependent) aspherical bow deviation. In consequence, the wafer exhibits two characteristic, orthogonal axes $L_1$ and $L_2$, with minimum curvature $C_1 = 1/r_1(L_1)) = C_{sph} - \Delta C_{asph}$ and maximum curvature $C_2 = 1/(r_2(L_2)) = C_{sph} + \Delta C_{asph}$, as depicted in FIG. 2a).

With simple mathematical derivations equation (2) can be approximated by multiple application of equation (3) for measuring $C_{sph}$ and $\Delta C_{asph}$ on a two-dimensional net of measurement loci $(x,y)$ across the wafer. In U.S. Pat. No. 7,391, 523 B1 this procedure is described using the spherical bow approximation. Here, the more realistic "azimuthal aspherical bow approximation" is applied. Hence, in the following the real wafer curvature is described as a two-dimensional variation of a two-component curvature $$C_{R,\phi}(R,\phi) = C_{sph}(R,\phi) + \Delta C_{asph}(R,\phi) \sin 2\phi \quad (4),$$

wherein, in order to allow for local variation of the axis orientation of L1 and L2 $\sin 2\phi$ has to be replaced by $\sin[2(\phi + \Delta \phi(R,\phi))]$.

In the present invention a method and an apparatus are provided, which enable the determination of the mean spherical curvature $C_{sph}$ and the azimuthal aspherical curvature deviation $\Delta C_{asph}$ of samples in multi-wafer reactors.

Figure 3:
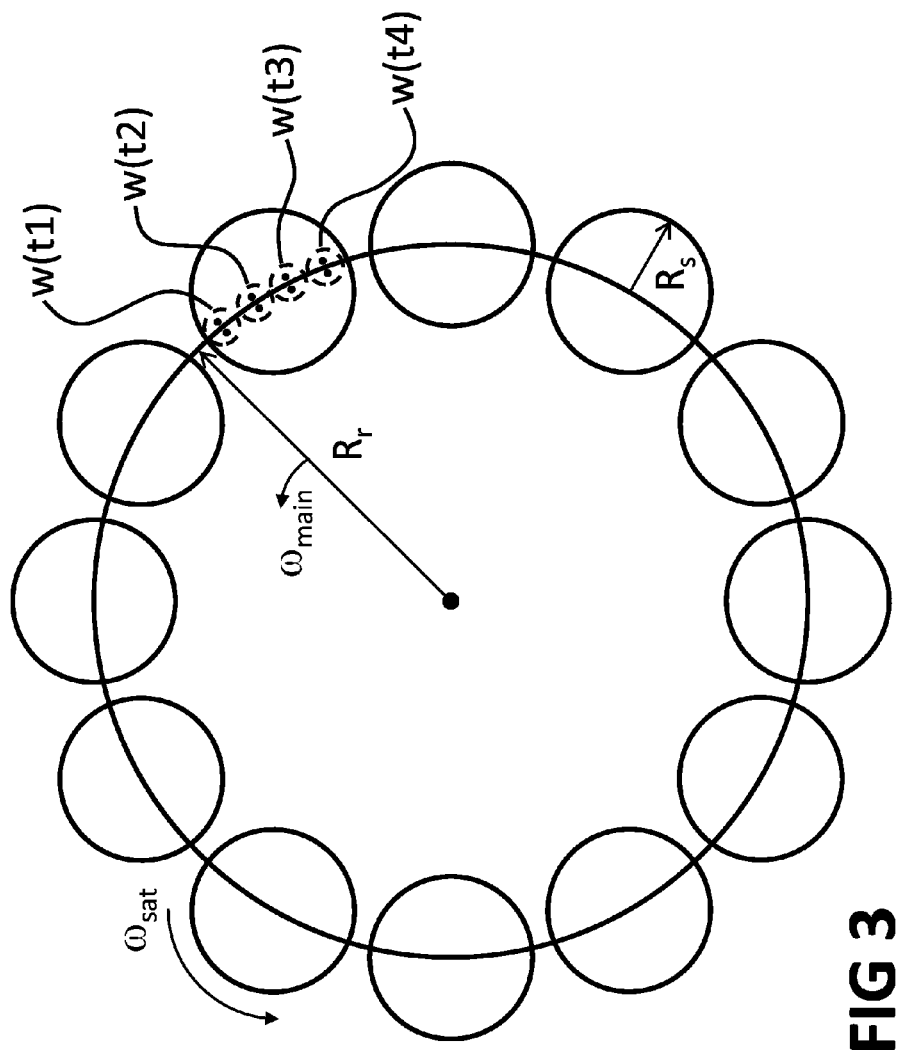
FIG. 3 is a schematic view of an exemplary multi-wafer reactor, wherein twelve wafers perform a common main rotation ($\omega_{main}$) and, additionally, each wafer rotates around its center with its own angular speed ($\omega_{sat}$)

As shown in FIG. 3, said multi-wafer reactors comprise a plurality of wafers (twelve in the exemplary embodiment of FIG. 3) which are arranged in a circle having a radius $R_r$, wherein the circle rotates with a main rotation speed $\omega_{main}$ around its center. Furthermore, $\omega_{sat}$ represents the angular speed of each wafer rotating around its own center. According to the present invention the angular speed of each wafer is zero ($\omega_{sat} = 0$) and the wafers only rotate around the center of the main circle.

According to the method and apparatus of the present invention, the mean spherical curvature $C_{sph}$ and the azimuthal aspherical curvature deviation $\Delta C_{asph}$ of each sample in multi-wafer reactors is determined by irradiating two laser beams onto the sample surface at subsequent sampling times t1, t2, t3, t4, etc. The sampling times are synchronized with the main rotation $\omega_{main}$ of the samples, so that at least two measurements are performed for each wafer.

FIG. 5 shows a schematic section of an apparatus according to the present invention for the measurement of the curvature of a sample surface 1. A semiconductor laser 2 generates a light beam 3, which is firstly guided through a first filter 11 and a lens 24 into a birefringent element P1. The main axis (respectively one of the main axes) of the birefringent element P1 is oriented with respect to the light beam 3 in such a way that the light beam 3 is split up into two partial beams, hereafter addressed to as first light beam S1 and second light beam S2, whereas after leaving the birefringent element P1 the first and second light beams S1 and S2 are guided in a parallel way.

The birefringent element P1 preferably comprises planar faces for light-entrance and—exit. Furthermore the main axis of the birefringent element P1 is oriented with respect to the incident light beam 3 (taking into account the polarisation of the light beam 3) in such a way, that the first light beam S1 and the second light beam S2 have the same or nearly the same intensity.

By means of a partially transmitting/reflecting mirror 19 the first and second light beams S1 and S2 are guided onto the sample surface 1, at which they are at least partially reflected and thereafter guided to a fast 2D-detector 5 by the partially transmitting/reflecting mirror 19 and a second filter 13. The first filter 11 serves for the suppression of unwanted emissions of the light source 2 and the second filter 13 serves for the suppression of the thermal radiation of the sample 12.

The fast 2D-detector 5 for detecting the positions of the reflected first and second light beams is coupled to a synchronizer 25, which is configured to synchronize the detector 5 with the rotation of the sample 12, so that every position of the first and second laser beams S1 and S2 sampled by the detector can be assigned to a rotation angle (or azimuthal angle) $\phi_{main}$ of the common main rotation $\omega_{main}$. In order to provide an exact synchronization between common main rotation $\omega_{main}$ and detector 5, a fast 2D-detector is needed. This can be achieved by using a camera with a high time resolution. A cheaper alternative is to use a detector 5 comprising two position sensitive detectors (PSD).

FIG. 6 shows a schematic view of a detector according to an exemplary embodiment of the present invention. The detector 5 comprises a polarizing beam splitter 27 and two identical position sensitive detectors (PSD) 26. Since the first and second light beams S1 and S2 exiting from the birefringent element P1 are in different polarization states and, more precisely, they are perpendicularly polarized with respect to each other, the polarizing beam splitter 27 can divide them in two output beams which are directed towards the first and second position sensitive detector 26, respectively. Once the two position sensitive detectors have been appropriately calibrated and both coupled to the synchronizer 25, they can simultaneously provide the position s1(x1,y1) of the reflected first light beam S1 and the position s2(x2, y2) of the reflected second light beam S2 for sampling times $t_i$ and $t_{i+1}$. In consequence, both embodiments of this invention, a fast double-beam 2D-detector utilizing a fast 2D-camera or a fast detector utilizing two PSDs after a polarizing beam splitter, can measure s1(t1), s1(t2), s2(t1) and s2(t2).

When the first and second light beams S1 and S2 are irradiated onto the sample surface 1 and reflected toward the front planar face, i.e. the face for light-entrance, of the fast double-beam 2D-detector, this 2D-detector registers the positions s1 and s2 of the spots (i.e. the center of the spots) where the reflected first and second light beams S1 and S2 hit the respective effective 2D detector plane.

The spots where the first and second light beams hit the surface on the wafer are arranged along a first direction (x direction) symmetrically with respect to the circumference of radius $R_r$ passing through the centers of all wafers. From these positions a first distance dx1(t1) between the reflected first light beam S1 and the reflected second light beam S2 measured at a first sampling time t1 and a second distance dx2(t2) between the reflected first light beam S1 and the reflected second light beam S2 measured at a second sampling time t2 can be calculated.

In case the sample surface 1 exhibits a convex shape along a first direction x determined by the spots where the first and second light beams S1 and S2 hit the sample surface 1 at the first sampling time t1, the first distance dx1(t1) measured at the detector 5 will be larger than the corresponding initial distances between the first and second light beams S1 and S2 before hitting the sample surface 1. On the contrary, the first distance dx1(t1) at the detector 5 will be smaller than the corresponding initial distance if the sample surface 1 has a concave shape along the first direction. Via the known parameters (distance between the light beams at the sample surface 1, distance between the reflected light beams at the detector 5 and distances and angles of the sample surface 1 with respect to the mirror 19 and to the detector 5) a curvature value $C_x(t1)$ for the first distance dx1 (extending along an axis from S1 to S2 at the sampling time t1) and a curvature value $C_x(t2)$ for the second distance dx2 (extending along an axis from S1 to S2 at the sampling time t2) can be calculated, which preferably is carried out by a device for data processing (not shown).

The mean value dx between the two distance measurements dx1 and dx2 at t1 and t2 is defined as dx=½(|s1(t1)−s2(t1)|+|s1(t2)−s2(t2)|)=0.5*(dx1+dx2).

Furthermore, since the radius $R_r$ of the main circumference is much larger than the radius $R_s$ of a wafer, the arc of circumference described by a wafer passing under the access viewport can be approximated with a linear translation along a second direction (y direction), in case the satellite rotation of the wafer is zero. Preferably, the spots where the first and second light beams hit the surface on the wafer are arranged so that the first direction (x direction) is perpendicular to the y direction along which the wafer is moving. Thus, according to the same algorithm exposed above, an averaged distance dy is determined by averaging the two distances dy1 and dy2, wherein dy1 is the distance between s1(t1) and s1(t2) and dy2 is the distance between s2(t1) and s2(t2), as shown in FIG. 7b.

In case the sample surface 1 exhibits a convex shape along the orthogonal direction y determined by the spots where the first and second light beams S1 and S2 hit the sample surface 1 at sampling times t1 and t2, the distances dy1 and dy2 measured at the detector 5 will be larger than the corresponding distances measured at a flat wafer. On the contrary, the distances dy1 and dy2 at the detector 5 will be smaller than the corresponding distances measured at a flat wafer in case the sample surface 1 has a concave shape along the y direction.

The mean value dy between the two distance measurements dy1 and dy2 at t1 and t2 is defined as dy=½(|s1(t1)−s1(t2)|+|s2(t1)−s2(t2)|)=0.5*(dy1+dy2).

Finally, a mean spherical curvature $C_{sph}$ and an azimuthal aspherical curvature deviation $\Delta C_{asph}$ can be determined from dx and dy.

A measurement on a flat wafer is performed, which serves as a calibration that delivers the "virtual" initial distance dy0 between the light beams S1(t1) and S1(t2) and between S2(t1) and S2(t2). Hence, via the known parameters (distance dx0 along x between the light beams S1 and S2 prior to reflectance at the sample surface 1, initial "virtual" distance dy0 between the light beams S1(t1) and S1(t2) and between S2(t1) and S2(t2), the distances dx and dy between the reflected light beams at the detector 5, distances and angles of the sample surface 1 with respect to the mirror 19 and to the detector 5 and the timing of the detector measurements) two curvature values $C_x(dx)$ and $C_y(dy)$ can be calculated.

The procedure can be repeated for several sampling times on each wafer and for each main rotation. The sampling spots on the wafer are symmetrically arranged with respect to the centre of the wafer. Thus, if an even number of measurements is performed on each wafer (e.g. t1, t2, t3, t4), the four spots corresponding to the two central sampling times (in the exemplary embodiment of FIG. 3 S1(t2), S2(t2), S1(t3) and S2(t3)) are symmetrically arranged around the centre of the wafer. Alternatively, if an odd number of measurements is performed on each wafer (e.g. t1, t2, t3, t4, t5), the two spots corresponding to central sampling time (for example S1(t3) and S2(t3) with 5 sampling times) are arranged symmetrically along a line passing through the centre of the wafer.

In this case, the two measured curvature values Cx and Cy directly correlate to the azimuthal asphericity $\Delta C_{asph}=|Cx−Cy|$ and to the mean, spherical component of curvature $C_{sph}=0.5*|Cx+Cy|$.

In addition, because both $C_{sph}$ and $\Delta C_{asph}$ can be measured for several sampling times $t_1 \ldots t_n$ during the transit of the wafer below the viewport and because $R_r \gg R_s$, the change of $C_{sph}$ and of $\Delta C_{asph}$ can be measured as a function of the local position on the wafer. By repeated application of this method, as shown in FIG. 7a, e.g. by assigning a "first sampling time" to $t_3$ and a "second sampling time" to $t_4$, also the radial variation of both $C_{sph}(R,\phi)$ and $\Delta C_{asph}(R,\phi)$ along a certain diagonal across the wafer can be measured in reactors without satellite rotation.

According to another preferred embodiment it is possible to radially scan the incident light beams from the periphery (R=−$R_s$) to the center (R=0) and again to the periphery (R=+$R_s$) of the sample surface (FIG. 2b). As a result, the local variation of $C_{sph}(R)$ along the y direction is measured. With proper alignment of the wafers in the reactor ($L_1$ parallel to the x direction and $L_2$ parallel to the y direction), this radial scan also provides $\Delta C_{asph}(R)$.

Both $C_{sph}(R)$ and $\Delta C_{asph}(R)$ can be utilized for the control of the epitaxial process.

All calculations preferably are carried out by a device for data processing (not shown).

It was found that a film relaxation of the sample and/or the formation of defects on the sample can be effectively detected by determining the azimuthal asphericity $\Delta C_{asph}(R=0)$ in the center of the wafer. Accordingly, with the method and apparatus proposed here, it is possible to detect more efficiently the formation of defects and/or film relaxation of the sample which allows enhanced process control in multi-wafer reactors having small view-ports and only main wafer rotation.

Furthermore, the radial variation of both $C_{sph}$ and $\Delta C_{asph}$ can be measured. This enables more efficient thin-film process optimization because for optimum yield both parameters $C_{sph}$ and $\Delta C_{asph}$ have to be zero for all points (R, $\phi$) on the wafer during specific critical deposition steps.

The main idea of the invention is to provide a method and an apparatus for determining the spherical and aspherical curvature of all wafers in a multi-wafer reactor with only small view-ports and without satellite rotation during fabrication processes. This method and apparatus separates in real-time the spherical component in the curvature and the aspherical component in the curvature by irradiating the sample surface with two parallel light beams in synchronicity with the rotation $\omega_{main}$ of the samples.

The determination of both $C_{sph}$ and $\Delta C_{asph}$ is an important tool for controlling the fabrication process, thus to minimize the bending of the sample surface. Moreover, the determination of the aspherical bow provides essential information for preventing the formation of defects and film relaxation during epitaxial growth. Since good thermal contact to the sample holder (susceptor) during the growth process is crucial for the entire wafer, it is also advantageous to be able to measure the curvature not only at one single spot in the center of the sample, but to determine the curvature during a full scan across the wafer.

One embodiment of the present inventions provides for an apparatus for measuring a curvature of a surface (1) of a wafer in a multi-wafer epitaxial reactor, comprising means for irradiating a first light beam (S1) and a second light beam (S2) onto a surface (1) of a sample (12), a detector (5) comprising at least one detector plane and being adapted to detect a first position of the reflected first light beam (S1) in the at least one detector plane and a first position of the reflected second light beam (S2) in the at least one detector plane at a first sampling time (t1) and to detect a second position of the reflected first light beam (S1) in the at least one detector plane and a second position of the reflected second light beam (S2) in the at least one detector plane at a second sampling time (t2), means (25) adapted to synchronize the detector (5) sampling time with the sample main rotation ($\omega_{main}$), means adapted to determine a first distance (dx1) between the first position of the reflected first light beam (S1) and the first position of the reflected second light beam (S2) measured at the first sampling time (t1), adapted to determine a second distance (dx2) between the second position of the reflected first light beam (S1) and the second position of the reflected second light beam (S2) measured at the second sampling time (t2), adapted to determine a third distance (dy1) between the first position of the reflected first light beam (S1) measured at the first sampling time (t1) and the second position of the reflected first light beam (S1) measured at the second sampling time (t2), and adapted to determine a fourth distance (dy2) between the first position of the reflected second light beam (S2) measured at the first sampling time (t1) and the second position of the reflected second light beam (S2) measured at the second sampling time (t2). The apparatus further comprises means for determining a mean spherical curvature of the surface and an azimuthal aspherical curvature deviation from the first distance, the second distance, the third distance and the fourth distance. The first light beam (S1) and the second light beam (S2) are parallel to each other.

| REFERENCE SIGN LIST | |
|---|---|
| 1 | surface |
| 2 | light source |
| 3 | light beam |
| 5 | 2D-detector |
| 11 | first filter |
| 12 | sample |
| 13 | second filter |
| 19 | partially transmitting mirror |
| 24 | lens |
| 25 | synchronizer |
| 26 | position sensitive detector |
| 27 | polarizing beam splitter |
| P1 | birefringent element |
| S1 | first light beam |
| S2 | second light beam |
| $\phi$ | rotation angle/azimuthal angle |
| $\omega_{main}$ | angular speed of the main rotation |
| $\omega_{sat}$ | angular speed of the satellite rotation |
| $R_s$ | sample radius/wafer radius |
| $R_r$ | radius of the circular arrangement of the wafer centers |
| $r_w$ | curvature radius of the sample/wafer |
| $C_{sph}$ | spherical curvature magnitude/component |
| $\Delta C_{asph}$ | azimuthal aspherical curvature deviation |

The invention claimed is:

1. Apparatus for measurement of a curvature of a surface of a wafer in a multi-wafer epitaxial reactor, comprising:
   means adapted for irradiating a first light beam and a second light beam onto a surface of a sample, wherein the first light beam and the second light beam are parallel to each other;
   a detector comprising at least one detector plane and being adapted to detect a first position of a reflected first light beam in the at least one detector plane and a first position of a reflected second light beam in the at least one detector plane at a first sampling time and to detect a second position of a reflected first light beam in the at least one detector plane and a second position of a reflected second light beam in the at least one detector plane at a second sampling time;
   means adapted to synchronize the detector sampling time with the sample main rotation ($\omega_{main}$);
   means adapted to determine:
   a first distance between the first position of the reflected first light beam and the first position of the reflected second light beam measured at the first sampling time;
   a second distance between the second position of the reflected first light beam and the second position of the reflected second light beam measured at the second sampling time;
   a third distance between the first position of the reflected first light beam measured at the first sampling time and the second position of the reflected first light beam measured at the second sampling time; and
   a fourth distance between the first position of the reflected second light beam measured at the first sampling time and the second position of the reflected second light beam measured at the second sampling time;
   means adapted to determine a mean spherical curvature ($C_{sph}$) of the surface and an azimuthal aspherical curvature deviation ($\Delta C_{asph}$) from the first to fourth distances.

2. The apparatus according to claim 1, further comprising means adapted to control fabrication process parameters for the sample according to the determined mean spherical curvature ($C_{sph}$) and/or according to the determined azimuthal aspherical curvature deviation ($\Delta C_{asph}$) from the mean curvature.

3. The apparatus according to claim 1, wherein the distance between the first light beam and the second light beam before reflection at the sample surface ranges between 0.5 mm and 5 mm.

4. The apparatus according to claim 1, wherein the means for irradiating the first light beam and the second light beam comprises:
- a light source for irradiation of an initial polarized, unpolarized or partially polarized single light beam,
- a birefringent element arranged between the light source and the surface of the sample such that the light beam of the light source passes through the birefringent element, wherein the main axis of the birefringent element is oriented with respect to the light beam of the light source such that the light beam is split up into the first and second light beams.

5. The apparatus according to claim 1, wherein the first light beam and the second light beam have the same intensity.

6. The apparatus according to claim 1 wherein the means adapted to synchronize the detector sampling time with the sample main rotation ($\omega_{main}$) are adapted to generate at least two sampling times for each wafer.

7. The apparatus according to claim 6, wherein the means adapted to synchronize the detector sampling time with the surface main rotation ($\omega_{main}$) are adapted to generate an even number of sampling times for each wafer and wherein the means for irradiating the first and second light beams is positioned in such a way to irradiate the first and second light beams at the two central sampling times on four spots of the surface of the sample symmetrically arranged around the centre of the surface of the sample.

8. The apparatus according to claim 1, wherein the detector comprises:
- a polarizing beam splitter adapted to separate the reflected first light beam from the reflected second light beam;
- a first position sensitive detector comprising one detector plane and being adapted to detect the position of the reflected first light beam in the detector plane; and
- a second position sensitive detector comprising one detector plane and being adapted to detect the position of the reflected second light beam in the detector plane.

9. Method for measurement of a curvature of a surface of a wafer in a multi-wafer epitaxial reactor, comprising:
- irradiating a first light beam and a second light beam onto a surface of a sample, wherein the first light beam and the second light beam are parallel to each other;
- detecting, by a detector comprising at least one detector plane, a first position of a reflected first light beam in the at least one detector plane and a first position of a reflected second light beam in the at least one detector plane at a first sampling time;
- detecting a second position of a reflected first light beam in the at least one detector plane and a second position of a reflected second light beam in the at least one detector plane at a second sampling time;
- determining a first distance dx1 between the first position of the reflected first light beam and the first position of the reflected second light beam measured at the first sampling time;
- determining a second distance dx2 between the second position of the reflected first light beam and the second position of the reflected second light beam measured at the second sampling time;
- determining a third distance between the first position of the reflected first light beam measured at the first sampling time and the second position of the reflected first light beam measured at the second sampling time; and
- determining a fourth distance between the first position of the reflected second light beam measured at the first sampling time and the second position of the reflected second light beam measured at the second sampling time;
- determining a mean spherical curvature ($C_{sph}$) and an azimuthal aspherical curvature deviation ($\Delta C_{asph}$) of the surface from the first to fourth distances.

10. The method of claim 9, further comprising the step of controlling fabrication process parameters for the sample according to the determined mean spherical curvature ($C_{sph}$) and/or according to the determined azimuthal aspherical curvature deviation ($\Delta C_{asph}$) from the mean spherical curvature.

11. The method according to claim 9, wherein the distance between the first light beam and the second light beam before reflection at the sample surface ranges between 0.5 mm and 5 mm.

12. The method according to claim 9, wherein the first and second light beams have the same intensity.

13. The method according to claim 9, wherein the sampling times of the detector are synchronized with the surface main rotation ($\omega_{main}$) so to generate at least two sampling times for each wafer.

14. The method according to claim 13, wherein each sample in the multi-wafer epitaxial reactor has a circular shape, wherein an even number of sampling times is generated for each wafer, and wherein the first and second light beams at the two central sampling times are irradiated on four spots of the surface of the sample symmetrically arranged around the centre of the surface of the sample.

* * * * *